(12) United States Patent
Hurrell

(10) Patent No.: US 8,217,703 B2
(45) Date of Patent: Jul. 10, 2012

(54) LOW POWER FAST LEVEL SHIFTER

(75) Inventor: Christopher Peter Hurrell, Berkshire (GB)

(73) Assignee: Analog Devices, Inc., Norwood, MA (US)

( * ) Notice: Subject to any disclaimer, the term of this patent is extended or adjusted under 35 U.S.C. 154(b) by 78 days.

(21) Appl. No.: 12/826,790

(22) Filed: Jun. 30, 2010

(65) Prior Publication Data

US 2012/0001673 A1 Jan. 5, 2012

(51) Int. Cl.
*H03L 5/00* (2006.01)

(52) U.S. Cl. ............................. 327/333; 326/81; 326/63

(58) Field of Classification Search .............. 326/62–63, 326/80–81; 327/306, 333
See application file for complete search history.

(56) References Cited

U.S. PATENT DOCUMENTS

| | | | |
|---|---|---|---|
| 5,378,943 A | 1/1995 | Dennard | |
| 5,751,178 A | 5/1998 | Shor et al. | |
| 6,011,421 A * | 1/2000 | Jung | 327/333 |
| 6,563,362 B2 * | 5/2003 | Lambert | 327/333 |
| 6,930,518 B2 * | 8/2005 | Kim et al. | 327/112 |
| 6,995,598 B2 | 2/2006 | Hochschild | |
| 7,227,400 B1 | 6/2007 | Gillespie et al. | |
| 7,724,485 B2 | 5/2010 | Worley et al. | |
| 2002/0175733 A1 | 11/2002 | Kondo | |
| 2005/0077919 A1 | 4/2005 | Sowden et al. | |
| 2007/0075793 A1 | 4/2007 | Maxim et al. | |
| 2008/0018360 A1 | 1/2008 | Williams | |
| 2009/0058491 A1 | 3/2009 | Kang et al. | |
| 2009/0230991 A1 | 9/2009 | Hung et al. | |

OTHER PUBLICATIONS

PCT International Search Report and Written Opinion for PCT/US11/40041 mailed on Oct. 5, 2011.

* cited by examiner

*Primary Examiner* — Dinh T. Le
(74) *Attorney, Agent, or Firm* — Kenyon & Kenyon LLP

(57) ABSTRACT

A lever shifter is provided for receiving a signal in a first voltage domain and providing an output signal in a second voltage domain. The level shifter reduces propagation delay and power consumption by mitigating contention between NFETs and PFETs during signal propagation.

36 Claims, 6 Drawing Sheets

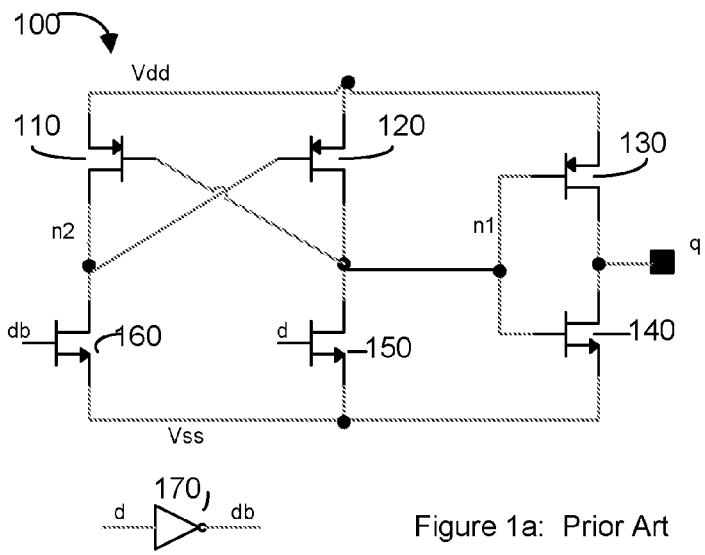
Figure 1a: Prior Art
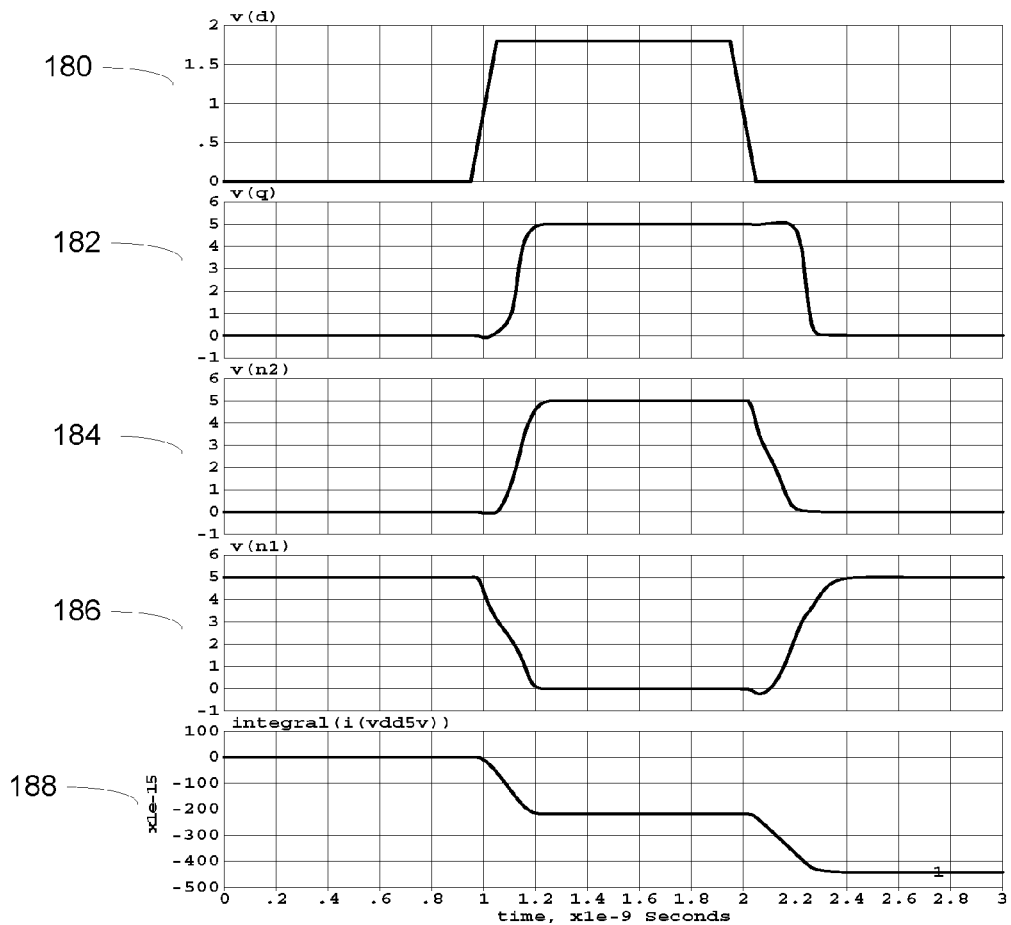
Figure 1b: Exemplary waveforms of circuit 100

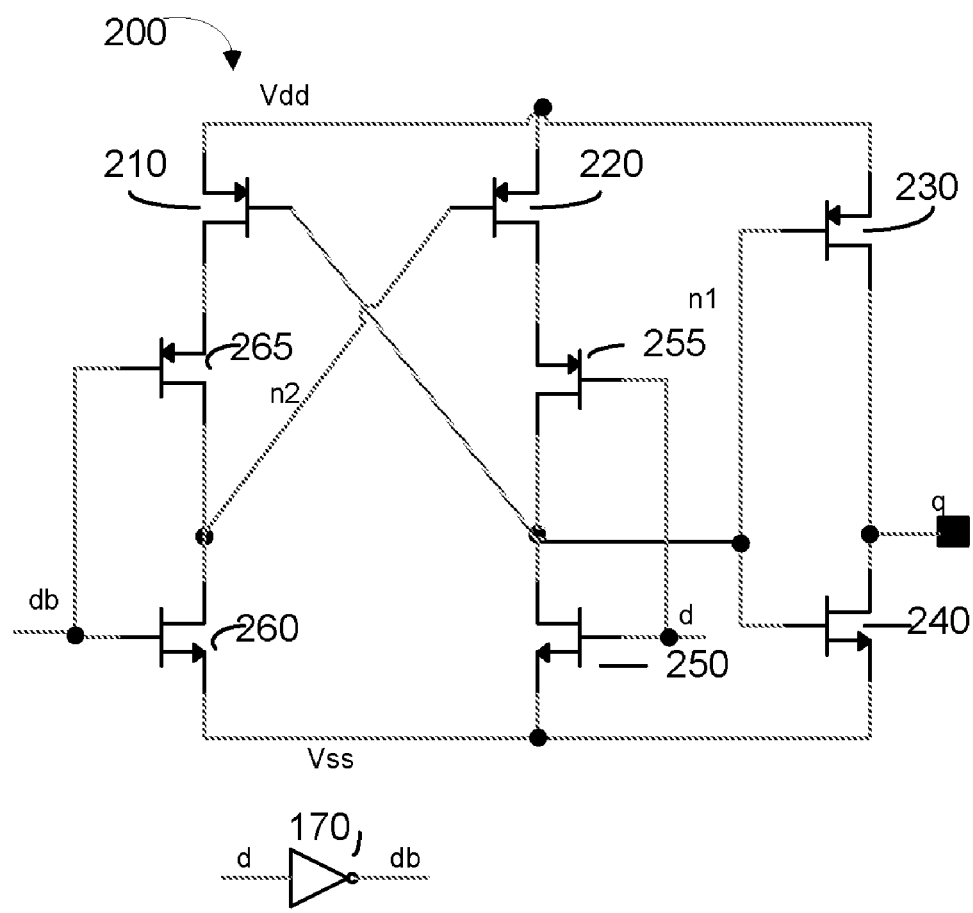
Figure 2: Prior Art

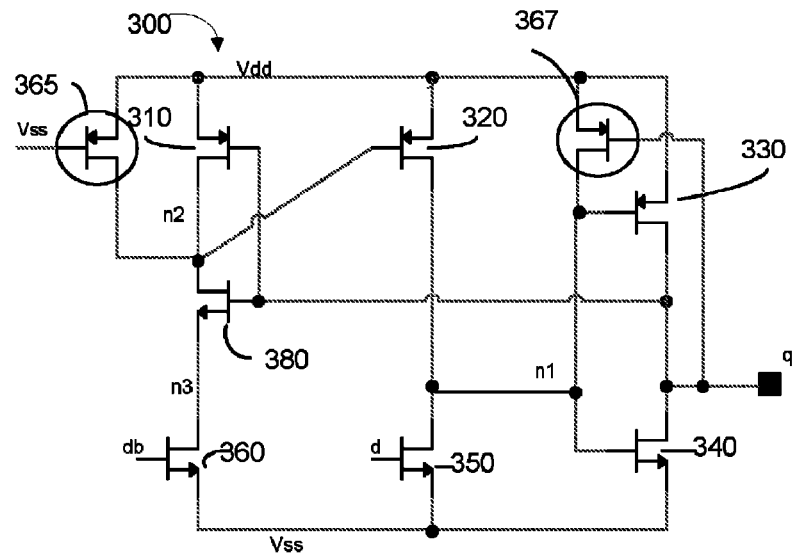
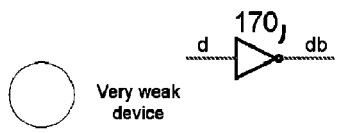
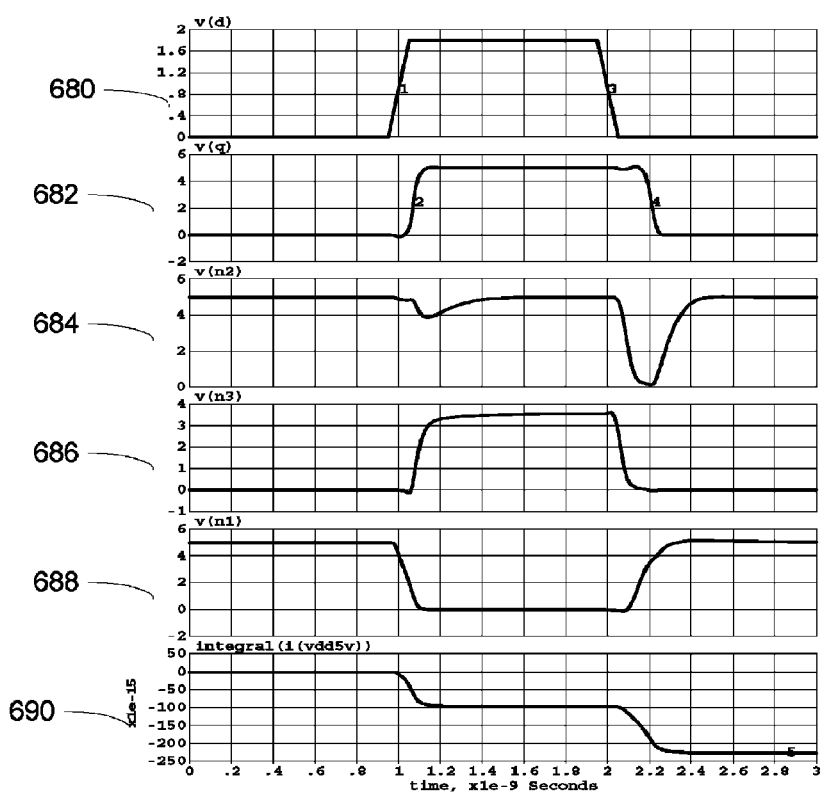
Figure 3a
Figure 3b

| d1 | d2 | q |
|---|---|---|
| 1 | 0 | 1 |
| 0 | 1 | 0 |
| 0 | 0 | q-1 |
| 1 | 1 | Undefined |

Very weak device

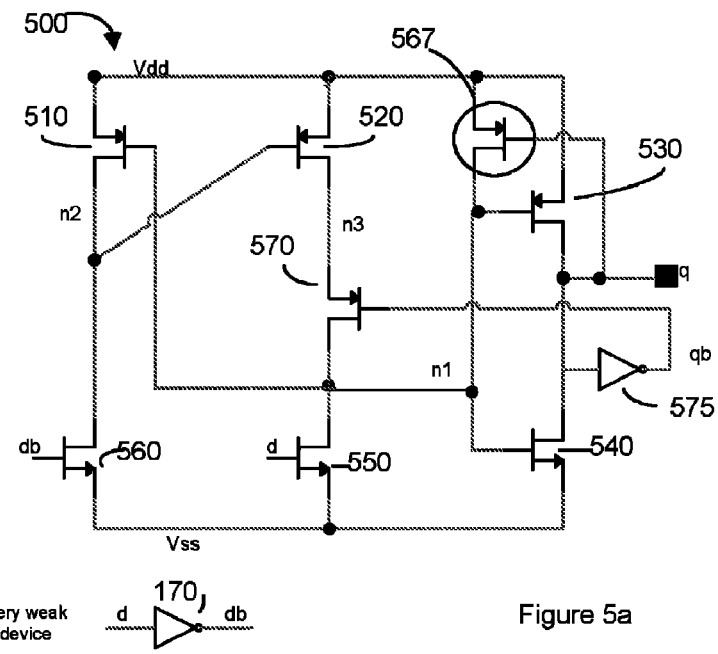
 
Figure 5a
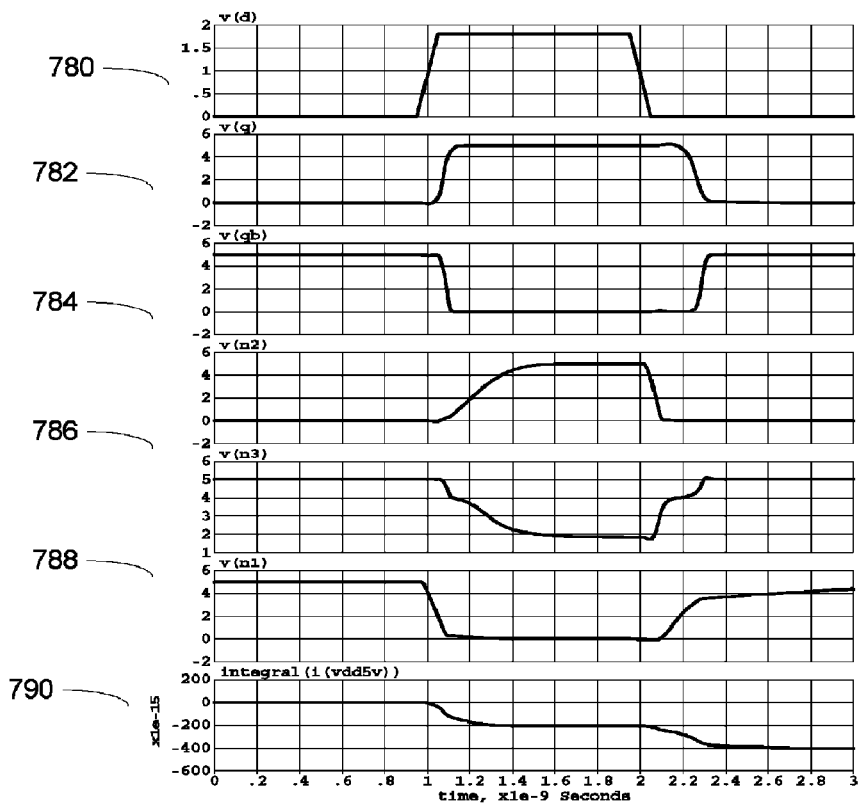
Figure 5b

Very weak device

| d1 | d2 | db1 | db2 | db3 | q |
|---|---|---|---|---|---|
| 1 | 1 | * | * | 0 | 1 |
| 1 | 1 | 0 | 0 | 1 | 1 |
| 0 | * | 1 | * | 1 | 0 |
| 0 | * | * | 1 | 1 | 0 |
| * | 0 | 0 | * | 1 | 0 |
| * | 0 | * | 1 | 1 | 0 |
| 0 | * | * | * | 0 | q-1 |
| * | 0 | * | * | 0 | q-1 |
| 0 | * | 0 | 0 | 1 | q-1 |
| * | 0 | 0 | 0 | 1 | q-1 |
| 1 | 1 | 1 | * | 1 | undefined |
| 1 | 1 | * | 1 | 1 | undefined |

LOW POWER FAST LEVEL SHIFTER

COPYRIGHT AND LEGAL NOTICES

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates generally to level shifters, and more particularly, to level shifters with higher speed and reduced power consumption.

BACKGROUND INFORMATION

Level shifters transfer signals between different domains. Typically, these domains operate under different voltage ranges. A level shifter transfers a signal generated from an integrated circuit operated under one voltage domain to an integrated circuit operated under another voltage domain.

FIG. 1a is illustrates a schematic of a conventional level shifter 100. It comprises cross-coupled PFETs 110 and 120 which are coupled to pull-down NFETs 160 and 150 respectively. FIG. 1b illustrates the relevant waveforms at some of the nodes. When input d is low, inverter 170 forces db to be high, thereby turning "OFF" NFET 150 while turning "ON" NFET 160. Since NFET 160 is "ON," the gate of the PFET 120 is pulled low, thereby pulling the drain of PFET 120 (node n1) high. Node n1 drives the output q of the inverter, comprising PFET 130 and NFET 140, to low. Subsequently, when d transitions to high, db is forced low by the inverter 170. Node n1 is pulled low by NFET 150, resulting in output q going high and PFET 110 being turned "ON". This pulls node n2 high, turning "OFF" PFET 120.

The drawback with configuration 100 is that it suffers from transition delay between the d input and the q output as well as from excessive power consumption. For example, when the d input transitions to high, there is contention between NFET 150 and PFET 120. During this transition phase, a shoot-through current goes from Vdd through PFET 120 and NFET 150 to Vss, resulting in substantial power loss. Curve 188 of FIG. 1b illustrates the integral of the current consumption, assuming a Vdd of 5V. Further, the contention between PFET 120 and NFET 150 (i.e., during a transition phase) contributes to the propagation delay between input d and output q. As node n1 is pulled low, PFET 110 is slowly turned "ON," which in turn gradually switches PFET 120 "OFF." The current in PFET 120, while NFET 150 is fighting with PFET 120 to bring node n1 to "LOW," is not usefully employed to discharge node n1. Accordingly, the propagation delay from node d going high to output q going low, increases.

FIG. 2 illustrates a schematic of an improved prior art level shifter 200. Level shifter 200 is similar to level shifter 100 except that it includes additional PFETs 255 and 265. The contention problem is alleviated because during transitions, PFET 220 and NFET 250 are both "ON" at the same time, while PFET 255, between the drains of PFET 220 and NFET 250, is turned "OFF." Similarly, contention between PFET 210 and NFET 260 is also avoided by PFET 265. Since contention during transition periods is reduced (i.e., there is no direct path between Vdd and Vss), shoot-through currents from Vdd to Vss are avoided. For example, when d goes high, PFET 255 is turned "OFF" while PFET 265 is turned "ON." PFET 220, which is in series with PFET 255, is turned "OFF" by the resulting high at node n2 (at the gate of PFET 220). Accordingly, the series connection of PFET 220 and PFET 255 prevents any current flow from Vdd through NFET 250 to Vss.

Level shifter 200 of FIG. 2, however, has the drawback of only avoiding contention between the respective PFETs and NFETs when the supply voltages are low enough to allow PFETS 255 and 265 to be turned "OFF" and "ON" effectively. For example, assuming that PFET 255 has a threshold of 1V, if the gate voltage of PFET 255 goes to 2.5V, representing a logic high at input d, PFET 255 can only be effectively turned "OFF" with a Vdd voltage of 3.5V or lower. Thus, with a Vdd voltage of 5V, PFET 255 cannot be turned "OFF" effectively. In this regard, a contention between PFET 220 and NFET 220 during transition periods is not prevented.

It is therefore a goal of an embodiment of the present invention to provide a level shift circuit and method with faster propagation times and less power consumption.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1a is shows a conventional level shifter circuit.

FIG. 1b shows the governing waveforms of the conventional level shifter of FIG. 1a.

FIG. 2 shows an improved level shifter circuit of the prior art.

FIG. 3a shows the first level shifter circuit in accordance with an embodiment of the present invention.

FIG. 3b shows the governing waveforms of the first level shifter circuit in accordance with an embodiment of the present invention.

FIG. 5a shows the third level shifter circuit in accordance with an embodiment of the present invention.

FIG. 5b shows the governing waveforms of the third level shifter circuit in accordance with an embodiment of the present invention.

DETAILED DESCRIPTION OF EXAMPLE EMBODIMENTS

Figure 4B:
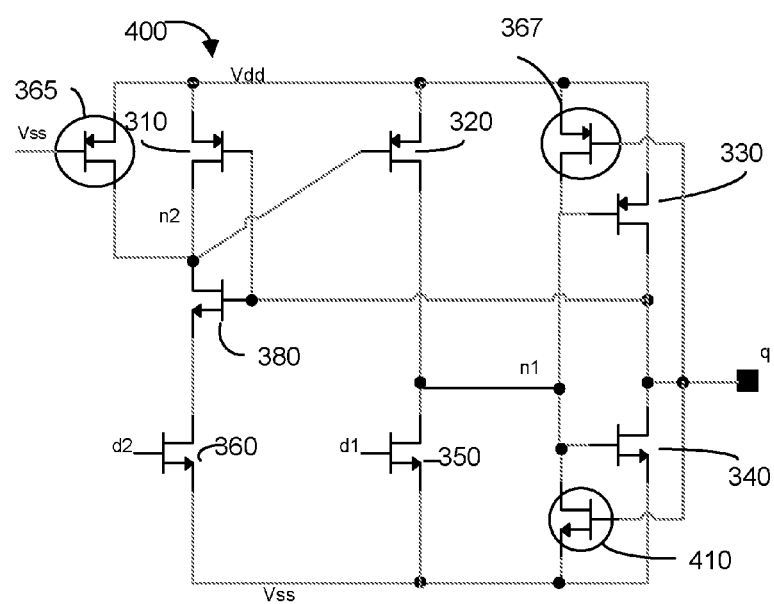
FIG. 4b shows the governing waveforms of the second level shifter circuit in accordance with an embodiment of the present invention.

FIG. 3a illustrates a circuit in accordance with an embodiment of the present invention. Circuit 300 includes an input d for receiving an input signal in a first voltage domain and an output q for providing an output signal in a second voltage domain. In one embodiment, the voltage range of the first domain is lower than the voltage range of the second domain. For example, in one embodiment, the voltage range of the first domain may be 0 to 1.8V and the voltage range of the second domain 0 to 5V. However, it is not necessary for the voltage range of the first voltage domain to be different from the second voltage domain. For example, in one embodiment, the first voltage domain may be identical to the second voltage domain. Further, in one embodiment, both voltage domains may have the same voltage ranges but may be generated by different supplies (e.g., a supply for the digital logic and a supply for the analog components, both operated, for example, at 1.8V).

In circuit 300 of FIG. 3a, the gate of the first NFET 350 receives the input signal d and its source is coupled to Vss. The gate of the second NFET 360 receives a signal db, which may be (but is not required to be) the complement of input signal d. In one embodiment, an inverter 170, which may operate from a supply voltage corresponding to the first voltage domain, may provide this complementary signal db. The source of the second NFET is coupled to Vss.

Circuit 300 further includes a third NFET 340, where the gate of the third NFET 340 is coupled to the drain of the first NFET 350, its source is coupled to Vss, and its drain is coupled to the output q. The fourth NFET 380, has its source coupled to the drain of the second NFET 360. The gate of the fourth NFET 380 is coupled to a complement of node n1 and is derived from n1. For example, this gate may be coupled directly to the output q or to the output of an odd chain of inverters driven by node n1.

Circuit 300 further includes a plurality of PFET's, each PFET having its source coupled to Vdd. A first PFET 320 has its drain coupled to the drain of the first NFET 350 and the gate of the third NFET 340 (node n1). A second PFET 310 has its drain coupled to the gate of the first PFET 320 (node n2). The gate of the second PFET 310 is coupled to a complement of node n1 and is derived from n1. For example, this gate may be coupled directly to the output q or to the output of an odd chain of inverters driven by node n1. In this regard, the gates of the second PFET 310 and the fourth PFET 380 may be (but are not required to be) connected together. A third PFET 330 has its gate coupled to the drain of the first NFET 350 and the gate of the third NFET 340, and its drain coupled to the output q.

In one embodiment circuit 300 may include a first resistance coupled between Vdd and the drain of the fourth NFET 380 and a second resistance coupled between Vdd and the gate of the third NFET 340. In one embodiment, the first resistance and the second resistance may comprise weak PFETs respectively (i.e., 365, 367). For example, the first resistance may comprise a weak PFET 365 with its source coupled to Vdd, its drain coupled to the drain of the fourth NFET 380, and its gate coupled to Vss. Further, the second resistance may comprise a weak PFET 367 with its source coupled to Vdd, its drain coupled to the gate of the third PFET 330, and its gate coupled to the output q. In one embodiment, the aspect ratio (W/L) of the first NFET 350 is thirty times the aspect ratio of the weak PFET 367. In one embodiment, the aspect ratio of the weak PFET 365 is about twice the aspect ratio of the weak PFET 367.

When the input signal d goes low, first NFET 350 is turned "OFF" while the second NFET 360 is turned "ON." Consequently, the output q goes low. A low at the output q turns "ON" the second PFET 310 while turning "OFF" the fourth NFET 380. Since the second PFET 310 is "ON," it provides a high signal to the gate of first PFET 320, thereby turning first PFET 320 "OFF." Accordingly, since the first PFET 320 is "OFF," signal contention between the first PFET 320 and the first NFET 350 is substantially reduced. As a result, the propagation delay between input d and output q is reduced. Also, the a shoot-through current between Vdd to Vss is prevented, resulting in less contention with first NFET 350 and reduced power consumption.

When input d transitions to high, the first NFET 350 is turned "ON," thereby turning "OFF" third NFET 340 while turning "ON" third PFET 330. Accordingly, output q goes high. Since, the fifth PFET 367 is weak, it is readily overpowered by the first NFET 350, thereby preventing any significant contention. For example, in one embodiment, the aspect ratio (W/L) of the weak fifth PFET 367 is 0.22/0.8 while the aspect ratio of the first NFET 350 is 1.5/0.18. Accordingly, the mobility of the first NFET 350 may be approximately 90 times the mobility of the weak fifth PFET 367. Further, as the output q transitions to high, it quickly chokes "OFF" the weak fifth PFET 367, contributing to faster operation and less contention. Further, PFET 310 is turned "OFF" and n2 is only held weakly high by PFET 365. Since PFET 310 is now "OFF," it will not be in contention with the second NFET 360 in the next transition (i.e., when input d goes low).

When input d subsequently transitions to low, its complement db goes high, thereby turning "ON" second NFET 360 and providing a low to the source of the fourth NFET 380 (node n3). Since fourth NFET 380 is still "ON" (from the previous cycle) the node n2 transitions to low and PFET 320 is turned "ON." The first PFET 320 provides a high signal at the gate of the third NFET 340 (node n1), thereby turning "ON" third NFET 340, which in turn pulls the output q low. As soon as output q is low, the fourth NFET 380 is turned "OFF" while the second PFET 310 is turned "ON," thereby turning "OFF" first PFET 320. Since first PFET 320 is now turned "OFF," it will not be in contention with the first NFET 350 in the next transition (i.e., when input d goes high).

Thus, in the next transition, it will be easier for first NFET 350 to pull node n1 low because the first NFET 350 will not be in contention with first PFET 320 (it is now "OFF"). In this regard, the first NFET 350 will only be in contention with the weak fifth PFET 367, which is easily overpowered by the first NFET 350. Accordingly, the fourth NFET 380 in combination with the second PFET 310 regulates when to keep the first PFET 320 "ON" in order to quickly pull high node n1 and to turn it "OFF" in anticipation of the next input transition to prevent contention between the first PFET 320 and the first NFET 350. As discussed above, the propagation delay between input d and output q is reduced, as well as the overall power consumption of the converter.

FIG. 3b illustrates some relevant waveforms of an exemplary simulation of circuit 300. The input d is transitioned from low—to high—to low (680). In this exemplary simulation, it is assumed that the first voltage domain is 0 to 1.8V while the second voltage domain is 0 to 5V. The integral of the current consumption is provided in waveform 690.

Figure 4A:
FIG. 4a shows the second level shifter circuit in accordance with an embodiment of the present invention.

FIG. 4a illustrates a circuit in accordance with another embodiment of the present invention. Circuit 400 has features similar to those of circuit 300 which need not be repeated here. Notable differences include a fifth NFET 410 whose drain is coupled to the gate of the third NFET 340, its source is coupled to Vss, and its gate is coupled to output q. In one embodiment, fifth NFET 410 is a weak NFET (e.g., W/L=0.22/1.8). As further regards, circuit 400, it does not need complementary inputs; instead, it has inputs d1 and d2. Accordingly, inverter 170 of FIG. 1a is is not necessary. As to the inputs d1 and d2, the truth table of FIG. 4b governs the allowable permutations. Accordingly, when inputs d1 and d2 are complements of one another, the output q follows input d1. When both inputs d1 and d2 are low, output q retains its previous state. Both inputs d1 and d2 are not allowed to be high simultaneously.

As further regards circuit 400, PFET 367 and NFET 410 maintain node n1 at a defined voltage when node n1 is not defined by the inputs d1 and d2. For example, node n1 may not be defined by the inputs when d1 and d2 are both low. In this regard, (when node n1 is not defined,) it may drift, ultimately resulting in both PFET 330 and NFET 340 to be both "ON" and a shoot-through current between Vdd and Vss.

Similarly, PFET 365 avoids n2 to drift low and turn "ON" PFET 320 when d1 is high. PFETS 365 and 367 are not required when the level shifter is switching fast enough to prevent nodes n1 and n2 from drifting.

FIG. 5a illustrates a circuit in accordance with yet another embodiment of the present invention. Circuit 500 includes an input d for receiving an input signal in a first voltage domain and an output q for providing an output signal in a second voltage domain. The voltage domains have features similar to those discussed in the context of circuit 300 and need not be repeated here.

In circuit 500 of FIG. 5a, the gate of the first NFET 550 receives the input signal d and its source is coupled to Vss. The gate of the second NFET 560 receives a signal db, which is the complement of input signal d. In one embodiment, an inverter 170 provides this complementary signal db. The source of the second NFET 560 is coupled to Vss.

Circuit 500 further includes a third NFET 540, where the gate of the third NFET 540 is coupled to the drain of the first NFET 550, its source is coupled to Vss, and its drain is coupled to the output q and to the input of an inverter 575. The inverter 575 provides a qb (the complement of q) at its output.

Circuit 500 further includes a plurality of PFETs. A first PFET 520 has its source coupled to Vdd and its gate coupled to the drain of second NFET 560 (node n2). A second PFET 510 has its source coupled to Vdd, its drain coupled to the gate of the first PFET 520 and the drain of NFET 560 (node n2), and its gate coupled to the drain of first NFET 550 and the gate of third NFET 540 (node n1). In one embodiment PFET 510 is a weak PFET. A third PFET 530 has its source coupled to Vdd, its gate coupled to the drain of the first NFET 550 and the gate of the third NFET 540 (node n1), and its drain coupled to the output q. A fourth PFET 570 has its source coupled to the drain of the first PFET 520 and its drain coupled to the drain of the first NFET 550 (node n1). The gate of the fourth PFET 570 is coupled to a complement of node n1 and is derived from n1. For example, this gate may be coupled directly to the complementary output qb or to the output of an even chain of inverters driven by node n1.

In one embodiment circuit 500 may include a resistance coupled between Vdd and the gate of the third PFET 530. In one embodiment, the resistance may comprise a weak PFET (i.e., 567). In this regard, the weak PFET 567 may have its source coupled to Vdd, its drain coupled to the gate of the third PFET 530, and its gate coupled to output q. In one embodiment the aspect ratio (W/L) of the first NFET 550 is thirty times the aspect ratio of the weak PFET 567.

As further regards circuit 500, in one embodiment (not shown), first PFET 520 and fourth PFET 570 may be swapped. Accordingly, the first PFET may have its gate coupled to a drain of the second NFET, its drain coupled to the drain of the first NFET. The fourth PFET, may have its source coupled to Vdd voltage, its drain coupled to the source of the first PFET 520, and its gate coupled to the complement of the output.

In circuit 500, when the input signal d goes low, first NFET 550 is turned "OFF" while the second NFET 560 is turned "ON." Node n2 is easily pulled low as PFET 510 may comprise a weak device, which then turns "ON" PFET 520. Since PFET 570 is still "ON," node n1 then goes high, turning "OFF" both second PFET 510 and third PFET 530 while turning "ON" third NFET 540. Since third NFET 540 is "ON," it pulls output q low. Shortly after q goes low, qb goes high, turning "OFF" the fourth PFET 570 as well as weak fifth PFET 567. Since fourth PFET 570 is now turned "OFF," PFET 520 will not be in contention with NFET 550 (which is in series with PFET 570) in the next transition (i.e. when input d goes high).

Subsequently, when input d transitions to high, the first NFET 550 is turned "ON" while the second NFET 560 is turned "OFF." Accordingly, node n1 is pulled low, turning "ON" third PFET 530, allowing output q to go high. Since the previous state of output q was low, the signal qb (at the gate of fourth PFET 570) is high, thereby holding the fourth PFET 570 "OFF." Accordingly, since the fourth PFET 570 is "OFF," there is no contention between first PFET 520 and first NFET 550. Further, since node n1 is pulled low, second PFET 510 is turned "ON," thereby providing a high signal at the gate of the first PFET 520. Also, first PFET 520 is turned "OFF," further preventing any signal contention between it and first NFET 550. Instead, NFET 550 may now be in contention only with the weak fifth PFET 567, which it easily overpowers. Accordingly, the propagation delay between input d and output q is reduced, as well as the overall power consumption of the converter 500.

FIG. 5b illustrates relevant waveforms of an exemplary simulation of circuit 500. The input d is transitioned from low—to high—to low (780). In this exemplary simulation, it is assumed that the first voltage domain is 0 to 1.8V while the second voltage domain is 0 to 5V. The integral of the current consumption is provided in waveform 790.

Figure 6A:
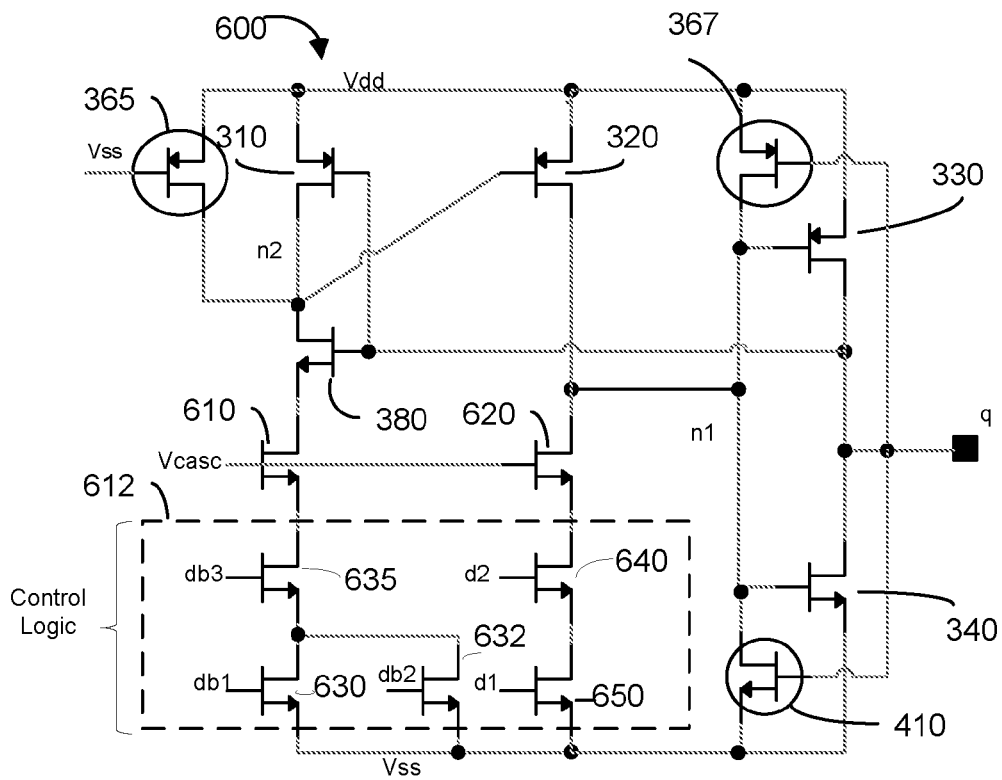
FIG. 6a shows the fourth level shifter circuit with a cascode stage and decoder logic in accordance with an embodiment of the present invention.

FIG. 6a illustrates a circuit in accordance with another embodiment of the present invention. Level shift circuit 600 has features similar to those of circuit 300 which need not be repeated here. Notable differences include a cascode stage protecting control logic 612. In one embodiment, the control logic 612 may comprise of high performance NFETS with short channel lengths (i.e., 0.18 μm). In this regard, the short channel length NFETS (i.e., NFETS 630 to 650) are protected from the Vdd supply by a first cascode NFET 610 and a second cascode NFET 620. Accordingly, first and second cascode NFETS 610 and 620 are included to provide current flow and to protect the cascode logic 612. However, circuit 600 can be implemented without cascode NFETS 610 and 620.

Figure 6B:
FIG. 6b shows the governing waveforms of the fourth level shifter circuit in accordance with an embodiment of the present invention.

FIG. 6b illustrates a truth table for an exemplary embodiment of the control logic 612 of the level shift circuit 600. The configuration of the control logic is application specific and may therefore be readily modified and even expanded with more inputs.

In yet another embodiment, the foregoing principles of the control logic 612 and cascode NFETS 610 and 620 may be applied to the circuit 500. In this regard, first NFET 550 and second NFET 560 may be replaced with NFETS 610 and 620, as well as control logic 612.

While the invention has been described in terms of particular embodiments, it will be obvious to those skilled in the art that, based upon the teachings herein, changes and modifications may be made without departing from the invention. The present invention as claimed, therefore, includes variations from the specific examples and embodiments described herein, as will be apparent to one of skill in the art. Accordingly, it is intended that the invention be limited only in terms of the appended claims.

What is claimed is:

1. A level shifter, comprising:
   an input for receiving an input signal in a first voltage domain and an output for providing an output signal in a second voltage domain;
   a first NFET, wherein a gate of the first NFET receives the input signal and a source of the first NFET is coupled to Vss voltage;
   a second NFET, wherein a gate of the second NFET receives a secondary control signal and a source of the second NFET is coupled to Vss voltage;
   a third NFET, wherein a gate of the third NFET is coupled to a drain of the first NFET, a source of the third NFET is coupled to Vss voltage, and a drain of the third NFET is coupled to the output;
   a fourth NFET, wherein a source of the fourth NFET is coupled to a drain of the second NFET;
   a first PFET, wherein a source of the first PFET is coupled to Vdd voltage and a drain of the first PFET is coupled to a drain of the first NFET and the gate of the third NFET;
   a second PFET, wherein a source of the second PFET is coupled to Vdd voltage, a gate of the second PFET is coupled to at least one of (a) the output and (b) the gate of the fourth NFET, and a drain of the second PFET is coupled to a gate of the first PFET; and
   a third PFET, wherein a source of the third PFET is coupled to Vdd voltage, a gate of the third PFET is coupled to a drain of the first NFET and the gate of the third NFET, and a drain of the third PFET is coupled to the output.

2. The lever shifter of claim 1, wherein the secondary control signal is a logical complement of the input signal.

3. The lever shifter of claim 1, wherein the secondary control signal is not a logical complement of the input signal.

4. The level shifter of claim 1, further comprising an odd chain of inverters, an input of which is coupled to the drain of the first PFET and an output of which is coupled to the gate of the fourth NFET.

5. The level shifter of claim 1, further comprising an odd chain of inverters, an input of which is coupled to the drain of the first PFET and an output of which is coupled to the gate of the second PFET.

6. The level shifter of claim 1, further comprising:
   a first resistance coupled between Vdd voltage and a drain of the fourth NFET; and
   a second resistance coupled between Vdd voltage and the gate of the third NFET.

7. The level shifter of claim 6:
   wherein the first resistance is a weak fourth PFET with its source coupled to Vdd voltage, its drain coupled to the drain of the fourth NFET, and its gate is coupled to Vss voltage; and
   wherein the second resistance is a weak fifth PFET with its source coupled to Vdd voltage, its drain coupled to the gate of the third PFET, and its gate coupled to the output.

8. The level shifter of claim 1, wherein a voltage range of the first voltage domain is lower than a voltage range of the second voltage domain.

9. The level shifter of claim 8, wherein the voltage range of the first voltage domain is 0 to 1.8V and the voltage range of the second voltage domain is 0 to 5V.

10. The level shifter of claim 1, wherein a voltage range of the first voltage domain is substantially similar to a voltage range of the second voltage domain but generated separately.

11. The level shifter of claim 1, wherein a voltage range of the first voltage domain is higher than a voltage range of the second voltage domain.

12. The level shifter of claim 1, wherein a voltage range of the first voltage domain and a voltage range of the second domain overlap.

13. The level shifter of claim 1, further comprising an inverter coupled between the gate of the first NFET and the gate of the second NFET.

14. The level shifter of claim 1, further comprising a fifth NFET, a drain of the fifth NFET being coupled to the gate of the third NFET, a source of the fifth NFET being coupled to Vss voltage, and a gate of the fifth NFET being coupled to the output.

15. The level shifter of claim 14, wherein the fifth NFET is a weak NFET.

16. The level shifter of claim 7, wherein an aspect ratio of the first NFET is at least 30 times the aspect ratio of the weak fifth PFET.

17. The level shifter of claim 14, wherein an aspect ratio of the first NFET is at least 30 times the aspect ratio of the weak fifth PFET.

18. The level shifter of claim 16, wherein an aspect ratio of the weak fourth PFET is at least twice the aspect ratio of the weak fifth PFET.

19. The level shifter of claim 1, wherein the fourth NFET in combination with the second PFET is configured to regulate when to keep the first PFET "OFF" in anticipation of the next input transition to prevent contention between the first PFET and the first NFET.

20. A level shifter, comprising:
   an input for receiving an input signal in a first voltage domain and an output for providing an output signal in a second voltage domain;
   a first NFET, wherein a gate of the first NFET receives the input signal and a source of the first NFET is coupled to Vss voltage;
   a second NFET, wherein a gate of the second NFET receives a complement of the input signal and a source of the second NFET is coupled to Vss voltage;
   a third NFET, wherein a gate of the third NFET is coupled to a drain of the first NFET, a source of the third NFET is coupled to Vss voltage, and a drain of the third NFET is coupled to the output;
   a first PFET, wherein a source of the first PFET is coupled to Vdd voltage, and a gate of the first PFET is coupled to a drain of the second NFET;
   a second PFET, wherein a source of the second PFET is coupled to Vdd voltage, a drain of the second PFET is coupled to the gate of the first PFET and the drain of the second NFET, and a gate of the second PFET is coupled to a drain of the first NFET and the gate of the third NFET;
   a third PFET, wherein a source of the third PFET is coupled to Vdd voltage, a gate of the third PFET is coupled to the drain of the first NFET and the gate of the third NFET, and a drain of the third PFET is coupled to the output;
   a fourth PFET, wherein a source of the fourth PFET is coupled to a drain of the first PFET, a drain of the fourth PFET is coupled to the drain of the first NFET, and a gate of the fourth PFET is coupled to a complement of a signal at the drain of the fourth PFET; and
   a first inverter, wherein an input of the first inverter is coupled to the gate of the first NFET and an output of the first inverter is coupled to the gate of the second NFET.

21. The level shifter of claim 20, further comprising a fifth PFET,
   wherein a source of the fifth PFET is coupled to Vdd voltage, a drain of the fifth PFET is coupled to the gate of the third NFET, and a gate of the fifth PFET is coupled to the output, and
   wherein the fifth PFET is a weak PFET.

22. The level shifter of claim 20, wherein a voltage range of the first voltage domain is lower than a voltage range of the second voltage domain.

23. The level shifter of claim 22, wherein the voltage range of the first voltage domain is 0 to 1.8V and the voltage range of the second voltage domain is 0 to 5V.

24. The level shifter of claim 20, wherein a voltage range of the first voltage domain is substantially similar to a voltage range of the second voltage domain but generated separately.

25. The level shifter of claim 20, wherein a voltage range of the first voltage domain is higher than a voltage range of the second voltage domain.

26. The level shifter of claim 20, wherein a voltage range of the first voltage domain and a voltage range of the second domain overlap.

27. The level shifter of claim 20, wherein the second PFET is a weak PFET.

28. A level shifter, comprising:
   an input for receiving an input signal in a first voltage domain and an output for providing an output signal in a second voltage domain;
   a first PFET, wherein a source of the first PFET is coupled to Vdd voltage;
   a second PFET, wherein a source of the second PFET is coupled to Vdd voltage and a gate of the second PFET is coupled to the output;
   a third PFET, wherein a source of the third PFET is coupled to Vdd voltage, a gate of the third PFET is coupled to a drain of the first PFET, and a drain of the third PFET is coupled to the output;
   a first NFET, wherein a drain of the first NFET is coupled to a gate of the first PFET and a drain of the second PFET, and a gate of the first NFET is coupled to the output;
   a second NFET, wherein a source of the second NFET is coupled to Vss voltage, a gate of the second NFET is coupled to the gate of the third PFET, and a drain of the second NFET is coupled to the output;
   a plurality of cascode NFETs, including a first cascode NFET and a second cascode NFET with their gates coupled to a cascode voltage,
      wherein a drain of the first cascode NFET is coupled to a source of the first NFET, and
      wherein a drain of the second cascode NFET is coupled to the drain of the first PFET; and
   a control logic block coupled to a source of the first cascode NFET and a source of the second cascode NFET.

29. The level shifter of claim 28, further comprising:
   a fourth PFET,
      wherein a source of the fourth PFET is coupled to Vdd voltage, a gate of the fourth PFET is coupled to Vss voltage and a drain of the fourth PFET is coupled to a gate of the first PFET and a drain of the second PFET, and
      wherein the fourth PFET is a weak PFET;
   a fifth PFET,
      wherein a source of the fifth PFET is coupled to Vdd voltage, a drain of the fifth PFET is coupled to the gate of the third PFET, and a gate of the fifth PFET is coupled to the output, and
      wherein the fifth PFET is a weak PFET;
   a third NFET,
      wherein a source of the third NFET is coupled to Vss voltage, a drain of the third NFET is coupled to the gate of the second NFET, and a gate of the third NFET is coupled to the output, and
      wherein the third NFET is a weak NFET.

30. The level shifter of claim 28, wherein the control logic block comprises high speed NFETs operated in a first voltage domain.

31. The level shifter of claim 30, wherein a voltage range of the first voltage domain is lower than a voltage range of the second voltage domain.

32. The level shifter of claim 31, wherein the voltage range of the first voltage domain is 0 to 1.8V and the voltage range of the second voltage domain is 0 to 5V.

33. The level shifter of claim 28, wherein a voltage range of the first voltage domain is higher than a voltage range of the second voltage domain.

34. The level shifter of claim 28, wherein a voltage range of the first voltage domain and the voltage range of the second domain overlap.

35. A level shifter, comprising:
   an input for receiving an input signal in a first voltage domain and an output for providing an output signal in a second voltage domain;
   a first NFET, wherein a gate of the first NFET receives the input signal and a source of the first NFET is coupled to Vss voltage;
   a second NFET, wherein a gate of the second NFET receives a complement of the input signal and a source of the second NFET is coupled to Vss voltage;
   a third NFET, wherein a gate of the third NFET is coupled to a drain of the first NFET, a source of the third NFET is coupled to Vss voltage, and a drain of the third NFET is coupled to the output;
   a first PFET, wherein a gate of the first PFET is coupled to a drain of the second NFET, and a drain of the first PFET is coupled to the drain of the first NFET;
   a second PFET, wherein a source of the second PFET is coupled to Vdd voltage, a drain of the second PFET is coupled to the gate of the first PFET and the drain of the second NFET, and a gate of the second PFET is coupled to a drain of the first NFET and the gate of the third NFET;
   a third PFET, wherein a source of the third PFET is coupled to Vdd voltage, a gate of the third PFET is coupled to the drain of the first NFET and the gate of the third NFET, and a drain of the third PFET is coupled to the output;
   a fourth PFET, wherein a source of the fourth PFET is coupled to Vdd voltage, a drain of the fourth PFET is coupled to the source of the first PFET, and a gate of the fourth PFET is coupled to a complement of the output; and
   a first inverter, wherein an input of the first inverter is coupled to the gate of the first NFET and an output of the first inverter is coupled to the gate of the second NFET.

36. The level shifter of claim 35, further comprising a fifth PFET,
   wherein a source of the fifth PFET is coupled to Vdd voltage, a drain of the fifth PFET is coupled to the gate of the third NFET, and a gate of the fifth PFET is coupled to the output, and
   wherein the fifth PFET is a weak PFET.

* * * * *